United States Patent [19]

Thebault

[11] 4,264,860
[45] Apr. 28, 1981

[54] RESISTOR MEASURING APPARATUS

[76] Inventor: Raymond R. Thebault, Appartement U-441, Ker Uhel, Lannion, France, 22300

[21] Appl. No.: 931,249

[22] Filed: Aug. 4, 1978

[30] Foreign Application Priority Data

Aug. 11, 1977 [FR] France .................. 77 24809

[51] Int. Cl.³ .................. G01R 27/02; G01R 27/14
[52] U.S. Cl. .................. 324/62; 324/64; 324/118
[58] Field of Search .............. 324/62, 64, 118, 115

[56] References Cited

U.S. PATENT DOCUMENTS

| 2,297,543 | 9/1942 | Eberhardt et al. | 324/118 |
| 2,871,446 | 1/1959 | Wann | 324/64 |

OTHER PUBLICATIONS

Moerschell et al., "Spreading Resistance Probe", IBM Tech. Dis. Bull., vol. 13, No. 11, Apr. 1971, p. 3365.
Allen et al., "An AC Silicon Resistivity Meter", Rev. of Sci. Instruments, vol. 32, No. 7, Jul. 1961, pp. 824–828.
Moffitt, L. R., "A Versatile . . . ", Conference: Proc. of the 9th Annual Rocky Mountain Bioengineering Symposium and the 10th Int. ISA Biomed. Sci. Instrum. Sym., vol. 9, Omaha, Neb., 1–3 May 1972, pp. 15–20.

*Primary Examiner*—Ernest F. Karlsen
*Attorney, Agent, or Firm*—Abraham A. Saffitz

[57] ABSTRACT

Apparatus for measuring a resistor in function of the amplitude of a direct current or the frequency and the amplitude of an alternating current. When the direct current equipment of this apparatus is used, the direct current signal flowing through the resistor is generated from an adjustable direct current generator and produces between terminals of the resistor a direct voltage signal which is chopped and amplified into a recurrent rectangular signal having a predetermined frequency and an amplitude proportional to the resistance value of resistor and included within a predetermined measurement interval. When the alternating current equipment of this apparatus is used, a first alternating current signal flowing through the resistor is generated from an adjustable frequency generator, an adjustable amplitude attenuator and a voltage-to-current converter. The first alternating current signal produces between terminals of the resistor an alternating voltage signal which is amplified and tuned in dependence upon the selected amplitude and frequency and also one of resistance value measurement ranges so as to produce a second alternating voltage signal having an amplitude proportional to the resistance value of resistor and included within the measurement interval. The recurrent voltage signal or the second alternating voltage signal rectified and filtered is transmitted to a display device including the measurement interval which is independent of the selected amplitudes, frequency and measurement range, for indicating the resistance value of the resistor as a function of the selected parameters of the respective current signal.

3 Claims, 5 Drawing Figures

RESISTOR MEASURING APPARATUS

BACKGROUND OF THE INVENTION

1. Field of the Invention

The present invention relates to an apparatus for measuring the resistance value of a resistor in function of parameters of a current signal which flows through the resistor. More particularly, this invention concerns—although not exclusively—a measuring apparatus especially well suited for measuring the resistance values of a resistor in function of the amplitude of a direct current signal flowing through the resistor or in function of the frequency and the amplitude of an alternating current signal flowing through the resistor.

2. Description of the Prior Art

In particular, the resistors measured by the measuring apparatus of this invention are that of relay contact blades inserted in known telephone exchanges. It has been noticed that the impedance value of a relay contact element and its insertion loss increase when the amplitude of the alternating current signal applied to the relay and having a predetermined frequency decreases. Complementarily, similar variations of the impedance value and the insertion loss of the relay contact element occured when the frequency of the alternating current signal having a predetermined amplitude fluctuates.

Known resistor measuring apparatus are only adapted for measuring resistors in function of one parameter of the current signal which flows through the resistor to be measured. These apparatus differ principally in their operation method:

either using a direct current signal by means of a measuring bridge, a d.c. supply and a d.c. microvoltmeter;

or using an alternating current signal by means of a measuring bridge, an a.c. supply producing an alternating current signal having a constant amplitude and an a.c. microvoltmeter.

Most alternating current apparatus carry out the resistor measurement at a frequency equal to 1000 Hz. Some of them can be connected to an auxiliary adjustable frequency generator.

In these known measuring apparatus, the amplitude of the current signal which flows through the resistor to be measured is determined with low accuracy or else cannot be adjusted. For instance, if resistance values of relay contact blades are measured, these apparatus do not hold the relays in the true operating conditions that exist in telephone exchanges.

OBJECTS OF THE INVENTION

Accordingly, an object of this invention is to provide a resistor measuring apparatus enabling measurements to be taken with great accuracy.

A more particular objet of this invention is to provide an apparatus for measuring resistance value of resistors through which flows a direct current signal or an alternating current signal having an amplitude known in great accuracy.

A further objet of this invention is to provide a resistor measuring apparatus generating a current signal which produces a direct voltage signal having an amplitude proportional to the resistance value of the resistor to be measured and included within a predetermined measurement interval independent of the resistance value of the resistor.

SUMMARY OF THE INVENTION

According to this invention, a measuring apparatus suited for resistor measurement using direct current and alternating current comprises:

The apparatus for measuring the resistance value of a resistor as a function of the amplitude of a direct current signal flowing through said resistor or as a function of the frequency and the amplitude of an alternating current signal flowing through said resistor, comprises:

first switchable generating means for generating direct current signals having predetermined amplitudes;

first switching means for controlling said first switchable generating means and thereby selecting a direct current signal having a predetermined amplitude;

second switchable generating means for generating alternating voltage signals having predetermined frequencies and a constant voltage amplitude;

second switching means for controlling said second switchable generating means and thereby selecting an alternating voltage signal having a predetermined frequency and said constant voltage amplitude;

switchable means for selectively attenuating said selected alternating voltage signal having a predetermined frequency and said constant voltage amplitude;

third switching means for controlling said switchable attenuating means and thereby selecting an alternating voltage signal having a predetermined frequency and a predetermined voltage amplitude;

voltage to current converter means for converting said alternating voltage signal having a predetermined frequency and a predetermined voltage amplitude to an alternating current signal having a predetermined frequency and a predetermined current amplitude;

means for selectively applying to said resistor, the resistance of which is to be measured, said direct current signal having a predetermined amplitude and said alternating current signal having a predetermined frequency and a predetermined current amplitude, thereby forming a direct voltage drop signal and an alternating voltage drop signal across said resistor;

means for chopping said direct voltage drop signal at a given frequency and filtering said chopped signal at the same frequency thereby forming a first output alternating signal;

means for amplifying said alternating voltage drop signal, thereby forming a second output alternating signal, said amplifying means being controlled by said third switching means whereby the amplification factor of the alternating voltage drop signal is equal to the attenuation factor of the selected alternating voltage signal;

a voltage meter; and means for selectively applying to said voltage meter the first and second output alternating signals.

DESCRIPTION OF THE PREFERRED EMBODIMENTS

Figure 1:
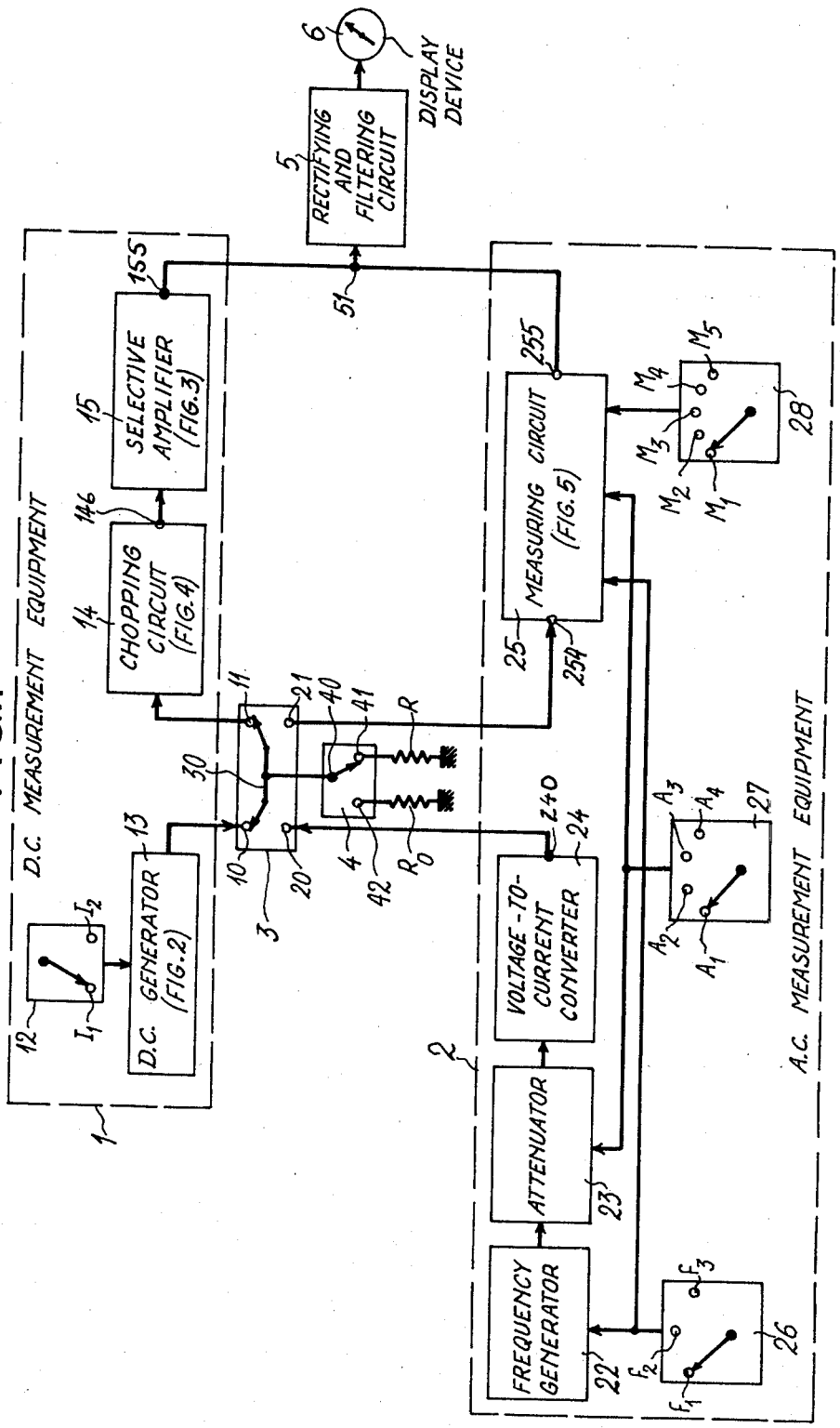
FIG. 1 is a schematic block diagram illustrating a resistor measuring apparatus unit which comprises two resistor measuring equipments designated to take measurements in direct current and in alternating current.

FIG. 1 shows a block diagram of the resistor measuring apparatus unit. For clarifying, common ground terminals of various functional blocks are omitted. Except where otherwise indicated, all signals are referenced to ground. Resistor measuring equipments 1 and 2 are designated for measuring a resistor R in direct current and in alternating current respectively.

These measuring equipments 1 and 2 are selectable by means of a four-contact switch 3 which has two pairs of input and output stationary contacts 10–11 and 20–21. When the input contact 10 is connected to the output contact 11, via the movable contact 30 of the switch 3, the equipment 1 using the direct current is selected. When the movable contact 30 connects the input contact 20 to the output contact 21, the equipment 2 using the alternating current is selected. The movable contact 30 of the switch 3 is also connected to the movable contact 40 of a two-contact switch 4. When the movable contact 40 engages a first stationary contact 41 of the switch 4, the resistor R is measured. When the movable contact 40 engages a second stationary contact 42 of the switch 4, a reference resistor $R_O$ is measured.

Figure 2:
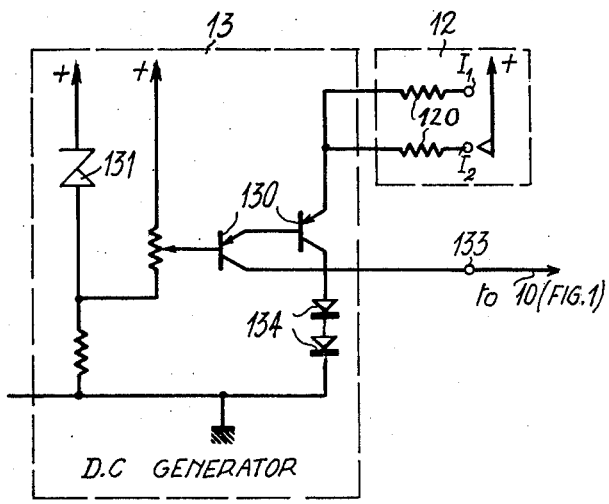
FIG. 2 illustrates the detailed circuit of the direct current generator of the equipment using direct current.

The direct current amplitudes produced in the measuring circuit 1 are, for instance, two in number $I_1$ and $I_2$, wthin a predetermined resistance value measurement range, and are selected by means of a two-contact switch 12 which selects the bias resistor of a direct current generator 13. The generator 13 is of the constant current type. As shown in FIG. 2, it comprises a two-transistor circuit 130 whose bias circuit includes a Zener diode 131 and the adjustable resistor 120. The collector of the first transistor is the output terminal 133 of the generator and the collector of the second transistor is grounded through two diodes 134 designed to limit the output voltage in open-circuit. In accordance with the selected resistance value measurement range, generator 13 delivers through the switches 3 and 4 having their movable contacts as illustrated in FIG. 1 a constant direct current signal I to the resistor R.

This constant direct current I produces a ground referenced direct voltage signal $V=RI$ which is directly proportional to the resistance value of the resistor R and which is chopped and amplified by a chopping circuit 14. The circuit 14 delivers to a selective amplifier 15 a pulsed rectangular signal having a voltage amplitude proportional to V. The fundamental component of this pulsed signal is extracted by selective amplifier 15 which is connected to the input terminal 51 of a rectifying and filtering circuit 5. This circuit 5, the input of which is connected to the outputs of the two measuring equipments 1 and 2, converts either the first sine signal transmitted from amplifier 15 or the second sine signal generated by equipment 2, into a direct voltage signal in order to permit the direct reading of the resistance value of the resistor R on the board of a display device 6 such as a digital voltmeter or a galvanometer.

Figure 3:
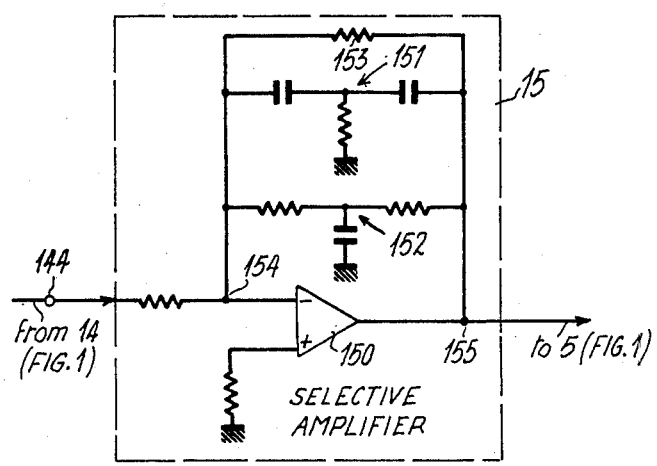
FIG. 3 illustrates the detailed circuit of the selective amplifier of the equipment using direct current.

As shown in FIG. 3, amplifier 15 can comprise an operational amplifier 150 whose feedback circuit includes two symmetrical T-section filters with resistor and capacitor 151, 152 which are defined by a predetermined resonance frequency 1/T. At this resonance frequency, the gain of the amplifier 15 is determined only by a resistor 153 which is connected in parallel to the terminals 154, 155 of the two symmetrical T-section filters. In this case, the rectifying and filtering circuit 5 delivers a direct voltage signal the amplitude of which is equal to the half-amplitude of the first sine signal which is transmitted to its input from the output terminal 155 of the amplifier 15.

Figure 4:
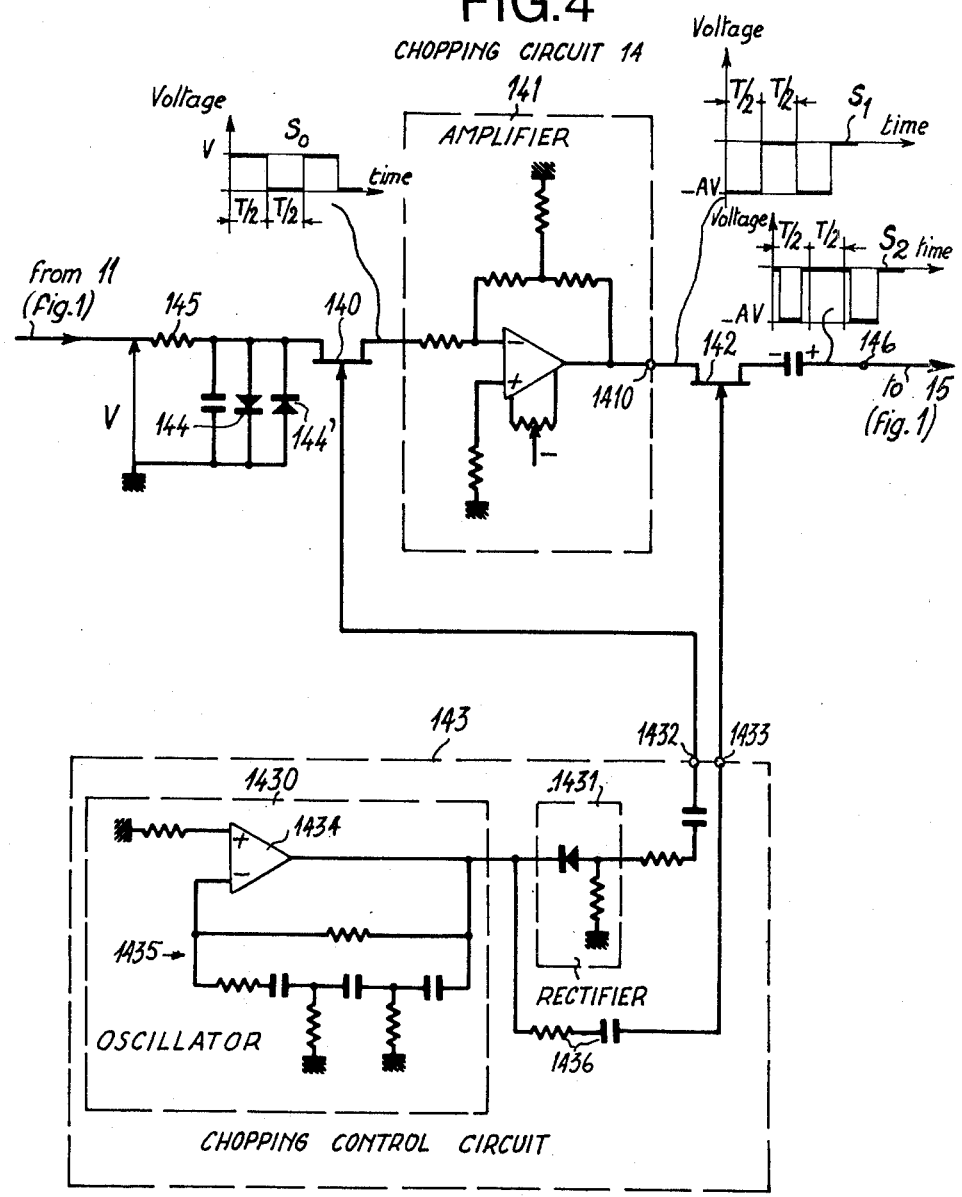
FIG. 4 is a schematic circuit diagram of the chopping circuit of the equipment using direct current.

In FIG. 4 is shown a more detailed diagram, partly in block form, of the chopping circuit 14. It includes essentially an input field effect transistor 140, an amplifier 141, an output field effect transistor 142 and a chopping control circuit 143.

The signal input terminal of the circuit 14 receives the direct voltage signal with respect to ground which is transmitted from the stationary contact 11 of the switch 3. At the input of circuit 14, two oppositely-poled diodes 144 and 144' couple the input resistor 145 to ground and protect the transistor 140 and amplifier 141. The input resistor 145 limits the current going through the diodes 144 and 144' in the event that a high voltage were applied across the terminals of the resistor R to be measured, this voltage being for instance equal to 48 volts when taking the measurements of the resistors of the telephone relay contact elements.

The input transistor 140 performs the chopping of ground referenced direct voltage V and produces the pulsed voltage signal $S_0$ having the period T. The amplifier 141 amplifies the signal $S_0$ with a negative gain $(-A)$ and delivers a rectangular pulsed signal $S_1$ having an amplitude $(-AV)$ and the period T. The signal $S_1$ contains peaks due especially to the drain-gate capacitor of the transistor 140 during its ground switching which is controlled by one, 1432, of the output terminals of the control circuit 143. The saturation of the output transistor 142 is less than that of the input transistor 140. These saturation periods are determined respectively by suitable chopping control signals which are delivered on the two output terminals 1433 and 1432 of the circuit 143. The stray signals produced at the instants of the rise and fall fronts chopped in the input signal V are thus cancelled on the output terminal 146 of the circuit 14. As illustrated in FIG. 4, the drain of the output field effect transistor 142 delivers the pulsed signal $S_2$ having the predetermined period T. The alternate half-waves of a period of this signal $S_2$ are respectively larger and smaller than that of the chopped and amplified signal $S_1$ which is transmitted from the output terminal 1410 of the amplifier 141.

In order to achieve the above-mentioned control signals, the chopping control circuit 143 comprises an oscillator 1430 and a half-wave rectifying circuit 1431. The oscillator 1430 includes an operational amplifier 1434 the feedback circuit of which is a RC phase-shifting circuit 1435. The outgoing sinusoidal signal of the circuit 1430 is rectified in the rectifying circuit 1431 the output terminal 1432 of which is connected to the gate of the input field effect transistor 140, and is also applied to the gate of the output field effect transistor 142 via a series RC-circuit 1436.

Referring again to FIG. 1, the measurement equipment 2 using alternating current comprises an alternating voltage signal generator 22 having an adjustable frequency f, an adjustable voltage amplitude attenuator 23, a voltage-to-current converter 24 the output terminal 240 of which is connected to the input stationary contact 20 of the switch 3 and a measuring circuit 25. The generator 22, the attenuator 23 and the converter 24 are of a known type. The input terminal 254 and the output terminal 255 of the measuring circuit 25 are connected to the stationary contact 21 of the switch 3 and the input terminal 51 of the rectifying and filtering circuit 5. In this case, the movable contact 30 of the switch 3 engages the stationary contacts 20 and 21.

According to the preferred embodiment illustrated in FIG. 1, the frequency generator 22 provides to the attenuator 23 an alternating voltage signal whose voltage amplitude is constant and whose frequency f is adjustable by means of a switch 26. Typically, this switch selects one out of three frequencies $f_1$, $f_2$ and $f_3$. The attenuator 23 attenuates without introducing distortion the voltage amplitude of the alternating signal with the selected frequency f which is generated by the generator 22. The voltage amplitude of the outgoing alternating signal which is delivered by the attenuator 23 is selected out of four voltage amplitudes $A_1$, $A_2$, $A_3$ and $A_4$ by means of a switch 27. Each amplitude level corresponds to a voltage attenuation factor out of 4. The voltage-to-current converter 24 receives the alternating voltage signal having the selected frequency f and amplitude level A and converts it into an alternating current signal having the selected frequency f and a current amplitude corresponding to the selected voltage amplitude. The measuring circuit 25 is controlled by the switches 26 and 27 for adapting its component circuits to the selected frequency and amplitude and is also controlled by a third switch 28. This switch 28 selects one out of five predetermined resistance ranges $M_1$, $M_2$, $M_3$, $M_4$ and $M_5$ to which the resistance value of resistor R belongs. Thus an alternating current signal having the selected frequency and the selected amplitude is delivered from the converter 24 to the resistor R to be measured and produces a ground referenced alternating voltage signal V which is processed in the measuring circuit 25.

Figure 5:
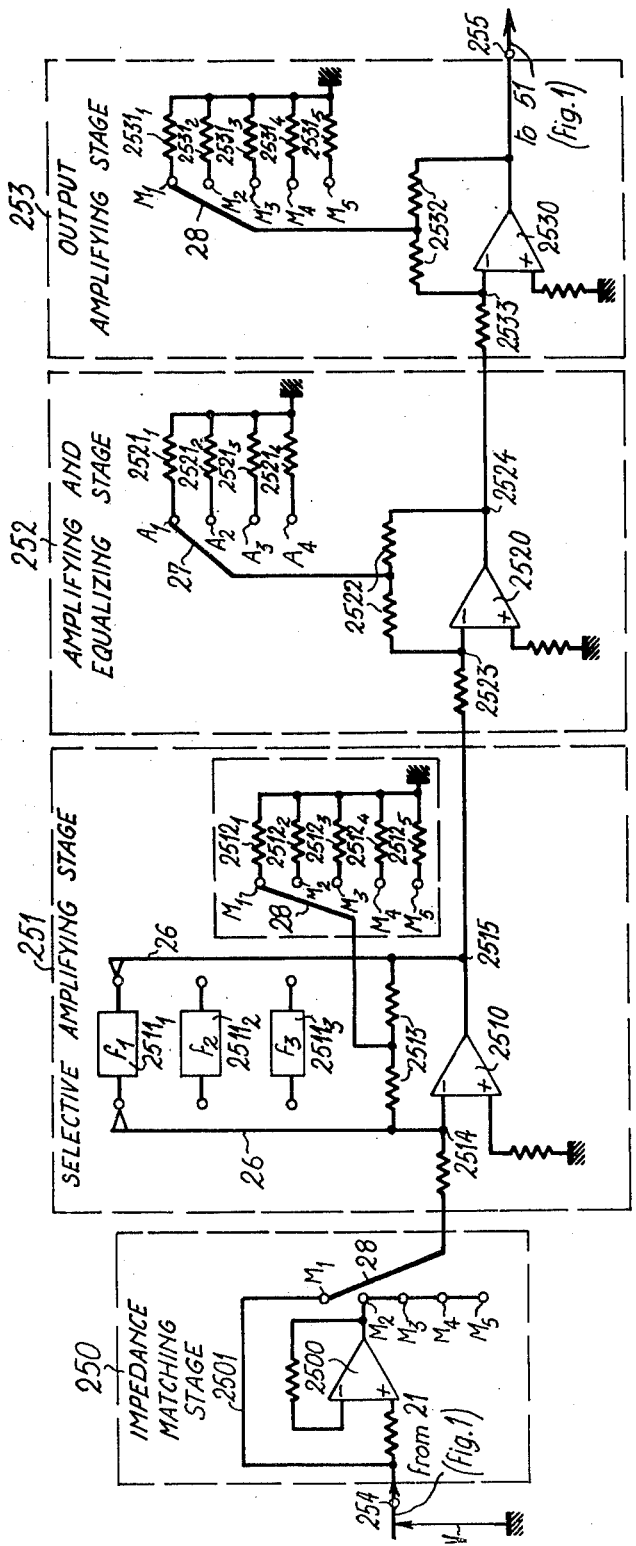
FIG. 5 is a schematic circuit diagram of the measuring circuit which is connected to the resistor to be measured and the rectifying and filtering circuit in the equipment using alternating current.

The FIG. 5 illustrates the detailed diagram of the measuring circuit 25. The signal V is applied to the input terminal 254 of an impedance matching stage 250 in order that the input impedance of the following stage 251 is constant whatever the resistance value of the resistor R may be. The stage 250 comprises an operational amplifier 2500 having a unity gain and a high input impedance. When the resistance value of the resistor R is very low compared with the input impedance of the following stage 251, i.e. when the resistor R belongs to the low resistance range $M_1$ which for instance includes the resistance values less than 1 ohm, the amplifier 2500 is short-circuited by the by-pass conductor 2501 under the control of the switch 28. When the resistor R belongs to other resistance ranges $M_2$ through $M_5$, the input terminal 254 is connected to the input terminal of the stage 251 via the operational amplifier 2500.

The following selective amplifying stage 251 includes an operational amplifier 2510 the feedback circuit of which comprises a filter 2511 and a T-section resistor circuit 2512-2513 which are connected in parallel between the invert input 2514 and the output 2515 of the amplifier 2510. The filter is selected by means of the switch 26 out of three filters $2511_1$, $2511_2$ and $2511_3$, each of which being tuned to a corresponding one of the three frequencies $f_1$, $f_2$ and $f_3$. The resistor circuit 2512-2513 comprises two equal resistors 2513 the common point of which is grounded through a resistor 2512. The resistor 2512 is selected by means of the switch 28 out of five resistors $2512_1$ through $2512_5$ with respect to the selected measurement range $M_1$ through $M_5$, respectively. The selected resistor 2512 sets the gain of the amplifier 2510.

The output terminal 2515 of the selective amplifying stage 251 is connected to the input terminal of an amplifying and equalizing stage 252. The stage 252 comprises an operational amplifier 2520. The feedback circuit of the amplifier 2520 includes a T-section resistor circuit 2521-2522 which is connected between the invert input 2523 and the output 2524 of the amplifier 2520. The resistor circuit 2521-2522 comprises two equal resistors 2522 the common point of which is grounded through a resistor 2521. The resistor 2522 is selected by means of the switch 27 out of four resistors $2521_1$ through $2521_4$ with regard to the selected amplitudes $A_1$ through $A_4$. Thus the stage 252 performs the inverse function of the attenuator 23.

The equalized outgoing signal is transmitted from the output terminal 2524 of the stage 252 to the input terminal of a following amplifying stage 253. The stage 253 is similar to the preceding stage 252. It comprises a T-section resistor circuit 2531-2532 which constitutes the feedback circuit of the operational amplifier 2530 of the stage 253. The two equal resistors 2532 of the T-section circuit 2531-2532 are interconnected to the invert input 2533 and the output 255 of the amplifier 2530 and are grounded by a resistor 2531 which is selected by means of the switch 28 out of five resistors $2531_1$ through $2531_5$. This selection of resistors is dependent upon the resistance value measurement ranges $M_1$ through $M_5$. Thus the output terminal 255 of the stage 253 transmits the second alternating voltage signal to the input terminal 51 of the rectifying and filtering circuit 5 which rectifies and filters it into a direct voltage signal. The display device 6 receives this direct voltage signal whose amplitude indicates the resistance value of the resistor R and is included within a predetermined constant measurement interval independent of the selected frequency f, the selected amplitude A and the selected resistance range M. These latter parameters permit a direct reading of the resistance value of the resistor R to be measured on the board of the display device 6. All the parameters are predetermined by measuring the reference resistor $R_0$.

The selector switches 12, 26, 27 and 28 perform switching operations by circuitry well known to those skilled in the art. The current intensity selecting switch 12 comprises one switching stage; the frequency selecting switch 26 comprises three switching stages for simultaneously selecting a frequency in the generator 22 and a filter 2511 in the amplifying stage 251; the amplitude selecting switch 27 includes two switching stages for simultaneously selecting a voltage amplitude in the attenuator 23 and a resistor 2521 in the amplifying and equalizing stage 252; finally, the measurement range selecting switch 28 comprises three switching stages for simultaneously selecting the conductor 2501 or the output terminal of the operational amplifier 2500 in the impedance matching stage 250, a resistor 2512 in the amplifying stage 251 and a resistor 2531 in the output amplifying stage 253.

In accordance with this invention, the resistor measuring apparatus unit only adapted to resistor measurements in direct current comprises the measuring equipment 1 using direct current, the resistor selecting switch 4 whose movable contact 40 is directly connected to the output terminal of the direct current generator 13 and the input terminal of the chopping circuit 14, the rectifying and filtering circuit 5, the input terminal 51 of which being connected only to the output terminal 155 of the selective amplifier 15 of the equipment 1, and the display device 6. The resistor measuring apparatus unit only adapted to resistor measurements in alternating current comprises the measuring equipment 2 using alternating current, the resistor selecting switch 4 whose movable contact 40 is directly connected to the output terminal 240 of the voltage-to-current converter 24 and the input terminal 254 of the measuring circuit 25, the rectifying and filtering circuit 5, the input terminal 51 of which being connected only to the output terminal 255 of the measuring circuit 25 of the equipment 2, and the display device 6.

By way of a non limitative example, a resistor measuring apparatus having a circuit diagram similar to that described above and adapted to measure the resistance values of relay contact blades used in telephone exchanges has the following operational features:

(a) for alternating current measurements:
three measurement frequencies lying within the usual telephone audio-frequency band: $f_1 = 800$ Hz, $f_2 = 1900$ Hz and $f_3 = 3000$ Hz;
four current amplitude levels expressed in nepers in accordance with telephone usage: $A_1 = 0$ Np, $A_2 = -1$ Np, $A_3 = -2$ Np and $A_4 = -4$ Np; the amplitude level $A_1$ corresponds to a voltage $V_1$ equal to 0.775 volt applied at the terminals of a 600Ω resistance, while the other A amplitude levels correspond to voltages V applied at the terminals of a 600Ω resistance given by the following formula:

$$V = V_1 e^N$$

five resistance ranges ranging between 20 mΩ and 10 kΩ: $M_1$ from 20 mΩ to 1Ω, $M_2$ from 1Ω to 10Ω, $M_3$ from 10Ω to 100Ω, $M_4$ from 100Ω to 1 kΩ and $M_5$ from 1 kΩ to 10 kΩ.

(b) for direct current measurements:
two current amplitudes: $I_1 = 1$ mA and $I_2 = 100$ mA;
one resistance value measurement range ranging between 20 mΩ and 1Ω.

In the latter case, the ground referenced maximum voltage $V_m$ applied to the terminals of the resistor R to be measured or to the input terminal of the chopping circuit 14 is equal to $$V_m = 1 \times 10^{-1} = 0.1 \text{ volt.}$$

In both types of measurement, the reference resistor $R_0$ is chosen as being equal to 1Ω.

Complementarily, the embodiment of resistor measuring apparatus described above is designed to operate either from batteries or from the mains voltage.

What I claim is:

1. A measuring apparatus for measuring the resistance value of a resistor as a function of the amplitude of a direct current signal flowing through said resistor or as a function of the frequency and the amplitude of an alternating current signal flowing through said resistor, said apparatus comprising:

first switchable generating means for generating direct current signals having predetermined amplitudes;

first switching means for controlling said first switchable generating means and thereby selecting a direct current signal having a predetermined amplitude;

second switchable generating means for generating alternating voltage signals having predetermined frequencies and a constant voltage amplitude;

second switching means for controlling said second switchable generating means thereby selecting an alternating voltage signal having a predetermined frequency and said constant voltage amplitude;

switchable means for selectively attenuating said selected alternating voltage signal having a predetermined frequency and said constant voltage amplitude;

third switching means for controlling said switching attenuating means and thereby selecting an alternating voltage signal having a predetermined frequency and a predetermined voltage amplitude;

voltage to current converter means for converting said alternating voltage signal having a predetermined frequency and a predetermined voltage amplitude to an alternating current signal having a predetermined frequency and a predetermined current amplitude;

means for selectively applying to said resistor, the resistance of which is to be measured, said direct current signal having a predetermined amplitude and said alternating current signal having a predetermined frequency and a predetermined current amplitude, thereby forming a direct voltage drop signal and an alternating voltage drop signal across said resistor;

means for chopping said direct voltage drop signal at a given frequency and filtering said chopped signal at the same frequency thereby forming a first output alternating signal;

means for amplifying said alternating voltage drop signal, thereby forming a second output alternating signal, said amplifying means being controlled by said third switching means whereby the amplification factor of the alternating voltage drop signal is equal to the attenuation factor of the selected alternating voltage signal;

a voltage meter; and means for selectively applying to said voltage meter the first and second output alternating signals.

2. A measuring apparatus as claimed in claim 1 wherein said means for chopping the direct voltage drop signal at a given frequency and fillering said chopped signal at the same frequency comprises a chopping control circuit, an amplifier, a first transistor connected to the input of said amplifier and a second transistor connected to the output of said amplifier, said first transistor receiving said direct current signal having a predetermined amplitude and a first chopping control signal from said chopping control circuit for chopping said direct current signal having a predetermined amplitude with a first on-off duty cycle, said second transistor receiving the amplified chopped current signal having a predetermined amplitude and a second chopping control signal from said chopping control circuit for chopping said amplified chopped direct current signal having a predetermined amplitude with a second on-off duty cycle different from the first duty cycle and a selective amplifier connected to said second transistor and tuned to said given frequency.

3. A measuring apparatus for measuring the resistance value of a resistor as a function of the amplitude of a direct current signal flowing through said resistor or as a function of the frequency and the amplitude of an alternating current signal flowing through said resistor, said apparatus comprising:

- first switchable generating means for generating direct current signals having predetermined amplitudes;
- first switching means for controlling said first switchable generating means and thereby selecting a direct current signal having a predetermined amplitude;
- second switchable generating means for generating alternating voltage signals having predetermined frequencies and a constant voltage amplitude;
- second switching means for controlling said second switchable generating means thereby selecting an alternating voltage signal having a predetemined frequency and said constant voltage amplitude;
- switchable means for selectively attenuating said selected alternating voltage signal having a predetermined frequency and said constant voltage amplitude;
- third switching means for controlling said switching attenuating means and thereby selecting an alternating voltage signal having a predetermined voltage amplitude;
- voltage to current converter means for converting said alternating voltage signal having a predetermined frequency and a predetermined voltage amplitude to an alternating current signal having a pedetermined frequency and a predetermined current amplitude;
- means for selectively applying to said resistor, the resistance of which is to be measured, said direct current signal having a predetermined amplitude and said alternating current signal having a predetermined frequency and a predetermined current amplitude, thereby forming a direct voltage drop signal and an alternating voltage drop signal across said resistor;
- means for chopping said direct voltage drop signal at a given frequency and filtering said chopped signal at the same frequency thereby forming a first output alternating signal;
- fourth switching means defining amplification factors in response to the resistance ranges of the resistor whose resistance is to be measured
- means for amplifying said alternating voltage drop signal, thereby forming a second output alternating signal, said amplifying means being controlled by both said third switching means and fourth switching means whereby by the amplification factor of the alternating voltage drop signal
- depends on the attenuation factor undergone by the selected alternating voltage signal and on the resistance range of the resistor whose resistance is to be measured;
- a volage meter; and
- means for selectively applying to said voltage meter the first and second output alternating signals.

* * * * *